(12) United States Patent
Zhou et al.

(10) Patent No.: US 10,824,070 B2
(45) Date of Patent: Nov. 3, 2020

(54) MASK, STITCHING EXPOSURE METHOD, AND DISPLAY PANEL HAVING THE MASK

(71) Applicant: NANJING CEC PANDA LCD TECHNOLOGY CO., LTD., Nanjing (CN)

(72) Inventors: Liufei Zhou, Nanjing (CN); Jie Wang, Nanjing (CN)

(73) Assignee: NANJING CEC PANDA LCD TECHNOLOGY CO., LTD., Nanjing (CN)

( * ) Notice: Subject to any disclaimer, the term of this patent is extended or adjusted under 35 U.S.C. 154(b) by 209 days.

(21) Appl. No.: 16/313,153

(22) PCT Filed: Jan. 24, 2017

(86) PCT No.: PCT/CN2017/072471
§ 371 (c)(1),
(2) Date: Dec. 25, 2018

(87) PCT Pub. No.: WO2018/068441
PCT Pub. Date: Apr. 19, 2018

(65) Prior Publication Data
US 2019/0155144 A1    May 23, 2019

(30) Foreign Application Priority Data

Oct. 10, 2016   (CN) .......................... 2016 1 0885326

(51) Int. Cl.
*G03F 1/38*     (2012.01)
*G03F 7/20*     (2006.01)
*G02F 1/1333*   (2006.01)
*G03F 9/00*     (2006.01)

(52) U.S. Cl.
CPC .............. *G03F 1/38* (2013.01); *G02F 1/1333* (2013.01); *G03F 7/2022* (2013.01); *G03F 9/7003* (2013.01); *G03F 7/70475* (2013.01)

(58) Field of Classification Search
CPC ........ G03F 1/38; G03F 7/2022; G03F 9/7003; G02F 1/1333
USPC ...................... 430/5, 22, 312, 394
See application file for complete search history.

(56) References Cited

FOREIGN PATENT DOCUMENTS

| | | |
|---|---|---|
| CN | 1362642 A | 8/2002 |
| CN | 101650525 A | 2/2010 |
| CN | 102819183 A | 12/2012 |
| CN | 203337996 U | 12/2013 |
| KR | 10-2011-0058353 A | 6/2011 |

*Primary Examiner* — Christopher G Young
(74) *Attorney, Agent, or Firm* — Cheng-Ju Chiang

(57) ABSTRACT

A mask, a stitching exposure method, a display panel, and a manufacturing method. The mask is used for manufacturing scan lines or data lines of a display panel by means of exposure; the mask plate is provided with a pattern area and a slit area located at the periphery of the pattern area; multiple exposure lines parallel to each other are provided in the pattern area; the multiple exposure lines are respectively continuous lines and used for manufacturing the scan lines or the data lines by means of exposure; the slit area is provided with a slit; the slit is used for disconnecting each scan line or data line at intermediate positions by means of exposure. The mask plate and the stitching exposure method can achieve disconnection of a scan line or a data line at intermediate positions in an exposure process.

19 Claims, 15 Drawing Sheets

MASK, STITCHING EXPOSURE METHOD, AND DISPLAY PANEL HAVING THE MASK

CROSS REFERENCE TO RELATED APPLICATION

The present application is a 35 U.S.C. § 371 National Phase conversion of International (PCT) Patent Application No. PCT/CN2017/072471, filed on Jan. 24, 2017, which is based on and claims a priority of Chinese Patent Application No. 201610885326.6, filed on Oct. 10, 2016, with a title of "Mask, Exposure Method, and LCD Panel", which is applied by Nanjing CEC Panda LCD Technology CO., Ltd. The entire disclosure of the above-identified applications, including the specification and claims are incorporated herein by reference in its entirety. The PCT International Patent Application was filed and published in Chinese.

FIELD OF THE INVENTION

The present disclosure relates to display technology, particularly, to a mask, a method of stitching exposure, a display panel and a method for preparing the same.

BACKGROUND OF THE INVENTION

Display panels with large size and high resolution always bring great senses of actual feeling and strong visual perception to audiences. Research from NHK shows that 8K*4K display panels whose resolution being 7680×4320 would provide a suitable resolution to audiences.

Conventionally, large-sized display panels are generally prepared by partial stitching exposure method. FIG. 1 shows a schematic view of conventional mask, wherein the numeral 200 refers to a mask, and the mask 200 is partitioned into three exposure areas, i.e., an exposure area A, an exposure area B and an exposure area C.

FIG. 2 is a schematic view of a large-sized display panel, which is formed by a method of partial stitching exposure by the mask 200 of FIG. 1. The display panel in FIG. 2 is partitioned into three panel areas, i.e., a panel area A, a panel area B and a panel area C. The panel area A of FIG. 2 is formed by being exposed by the exposure area A in FIG. 1 correspondingly. The panel area B in FIG. 2 is formed by being exposed by the exposure area B in FIG. 1 correspondingly. The panel area C in FIG. 2 is formed by being exposed by the exposure area C in FIG. 1 correspondingly. Meanwhile, a source driver 110 and a scan driver 120 are also provided in FIGS. 2 and 3.

It would be more complex for the preparation of large-size display panels with high resolution, the reason is that when pixels thereof become small, a series of problems would occur, for example, a linear density thereof would increase, a width thereof would be tapered, a load thereof would increase, and a charging-time thereof would shorten, etc.

To solve the problems above, the display panel is partitioned into four display areas, as shown in FIG. 3. Under the condition that the display panel is partitioned into four separate display areas P1, P2, P3 and P4, the number of scan lines would be halved in each display area, and high-side/low-side gate drivers would scan simultaneously when displaying a frame. Along this, the charging-time would be at least doubled when charging the same frame, since the charging-time=1/(refresh frequency×the scan lines number). An 8K*4K display panel would be driven by the source driver 110 and the scan driver 120 as shown in FIG. 3, and by four 4K*2K timing controllers (abbr. as TCON) as shown in FIG. 4.

If the display panel is driven under the condition of being partitioned into four separate display areas, both data lines and scan lines are required to be disconnected at intermediate positions thereof corresponding to where the display areas are partitioned. However, when preparing the large-sized display panel of FIG. 2 by the method of partial stitching exposure under the mask 200 of FIG. 1, stitching directions of the exposure areas A, B and C are the same as that of the scan lines or the data lines. Hence, the method of partial stitching exposure under the same mask fails to derive the scan lines or data lines disconnected at the intermediate positions.

SUMMARY OF THE INVENTION

To solve the problems above, the present disclosure provides a mask, a method of stitching exposure, a display panel and a method for preparing the same, wherein the scan lines or the data lines are disconnected at intermediate positions during exposure process. The present disclosure is suitable for preparing large-sized display panels.

The present disclosure provides a mask applied for preparing scan lines or data lines of the display panel by means of exposure, the mask is provided with a pattern area and a slit area located at a periphery of the pattern area, the pattern area are provided with multiple exposure lines parallel to each other, the multiple exposure lines are respectively continuous lines and are applied to prepare the scan lines or the data lines by means of exposure; the slit area is provided with a slit, the slit is applied to disconnect each of the scan lines or the data lines at intermediate positions by means of exposure.

The pattern area of the mask is partitioned into three exposure areas, i.e., a first exposure area, a second exposure area and a third exposure area respectively, the first exposure area, the second exposure area and the third exposure area are applied to stitching expose three different areas of the display panel respectively.

The first exposure area locates at the bottom of the pattern area, the second exposure area locates in the middle of the pattern area, the third exposure area locates at the upper of the pattern area, the first exposure area partially overlaps with the second exposure area, the second exposure area partially overlaps with the third exposure area.

The multiple exposure lines extend along a first direction, the slit extends along a second direction, and the second direction is perpendicular to the first direction.

In one embodiment, the multiple exposure lines extend along a height direction of the pattern area, the slit extends along a width direction of the pattern area, and a length of the slit equals to a width of the pattern area.

The slit is located at one side of the pattern area and next to the pattern area.

In one embodiment, the slit is discontinuous and includes several slots spacing with each other, the several slots correspond to the multiple exposure lines respectively.

In another embodiment, the slit is continuous, and a length thereof equals to a width of the pattern area.

The present disclosure also provides a method of stitching exposure under the mask, applied for preparing scan lines or data lines of the display panel by means of exposure, the method of stitching exposure includes the following steps: coating a photoresist layer onto a metal layer which is previously formed; stitching exposing different areas of the photoresist layer respectively along a first direction under a pattern area of the mask; aligning a slit in the slit area of the mask with intermediate positions of each scanline or data line to be disconnected, and exposing the photoresist layer by the slit along a second direction, wherein the second direction is perpendicular to the first direction; developing the photoresist layer after exposure, and etching the metal layer after developing, thus forming a plurality of scan lines or data lines which are parallel to each other and disconnected at intermediate positions.

In one embodiment, the step of stitching exposing different areas of the photoresist layer respectively by the pattern area of the mask along the first direction includes the following steps: partitioning the pattern area of the mask into three exposure areas consisting of a first exposure area, a second exposure area and a third exposure area separately, and stitching exposing the three different areas of the photoresist layer along the first direction by the first exposure area, the second exposure area and the third exposure area respectively.

The present disclosure further provides a display panel, which includes several pixel cells defined by the scan lines and the data lines insulating and interlacing with each other, the display panel includes four separate display areas which are square-shaped, both the scan lines and the data lines of the display panel are disconnected at intermediate positions thereof; one of the scan lines and the data lines is formed under a first mask by means of exposure, the other of the scan lines and the data lines is formed under a second mask by means of exposure; the first mask is the mask described above; the second mask is provided with a pattern area, and multiple exposure lines parallel to each other are arranged in the pattern area of the second mask, the multiple exposure lines therein are discontinuous lines which are disconnected at intermediate positions.

The present disclosure further provides a method for preparing a display panel, the display panel includes several pixel cells defined by scan lines and data lines insulating and interlacing with each other, the method includes the following steps: forming either of the scan lines and the data lines under a first mask, and forming the other of the scan lines and the data lines under a second mask; the first mask is the mask described above; the second mask is provided with a pattern area, and multiple exposure lines parallel to each other are arranged in the pattern area of the second mask, the multiple exposure lines therein are discontinuous lines which are disconnected at intermediate positions; the prepared display panel includes four separate display areas which are square-shaped, and both the scan lines and the data lines of the display panel are disconnected at intermediate positions.

The pattern areas of the second mask and the first mask are in the same size.

In the mask and the method for stitching exposure provided in the present disclosure, large-sized display panel is formed by a method of partial stitching exposure. During the exposure process, the scan lines or the data lines would be disconnected at intermediate positions. Along this, the prepared display panel is partitioned into four separate display areas, loads of the scan lines and the data lines are at least halved, and signals transferred thereby are not inclined to distort; furthermore, the number of the scan lines is halved in each display area, and the charging-time is at least doubled, problems including distortion, flicker and motion-blurred images are solved. Meanwhile, the difficulty for preparing the display panel and the production cost thereof are also reduced.

To make the above-mentioned purposes, characteristics and advantages more apparent and understandable, detailed description accompanying preferred embodiments are given below.

DETAILED DESCRIPTION OF PREFERRED EMBODIMENTS

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
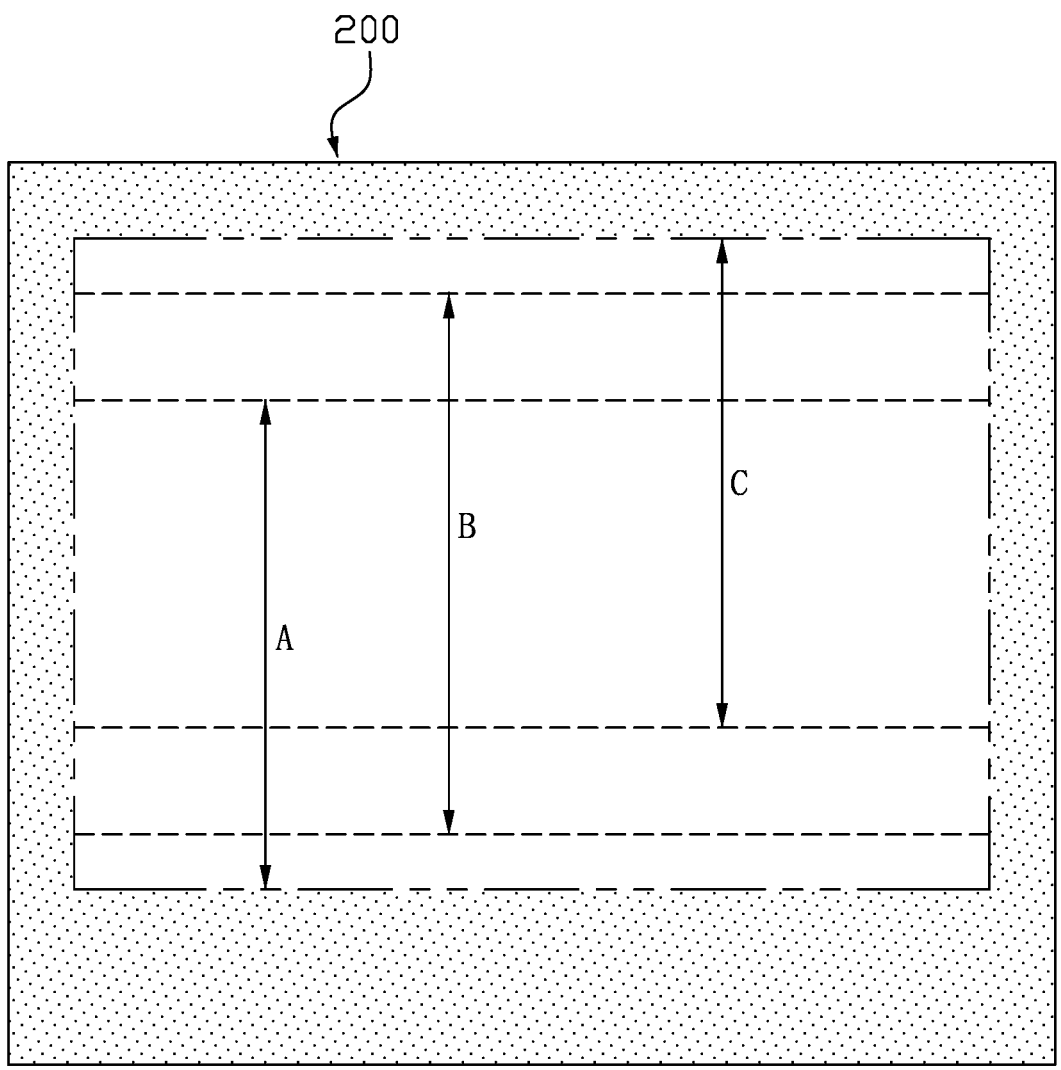
FIG. 1 shows a schematic view of previous mask.
Figure 2:
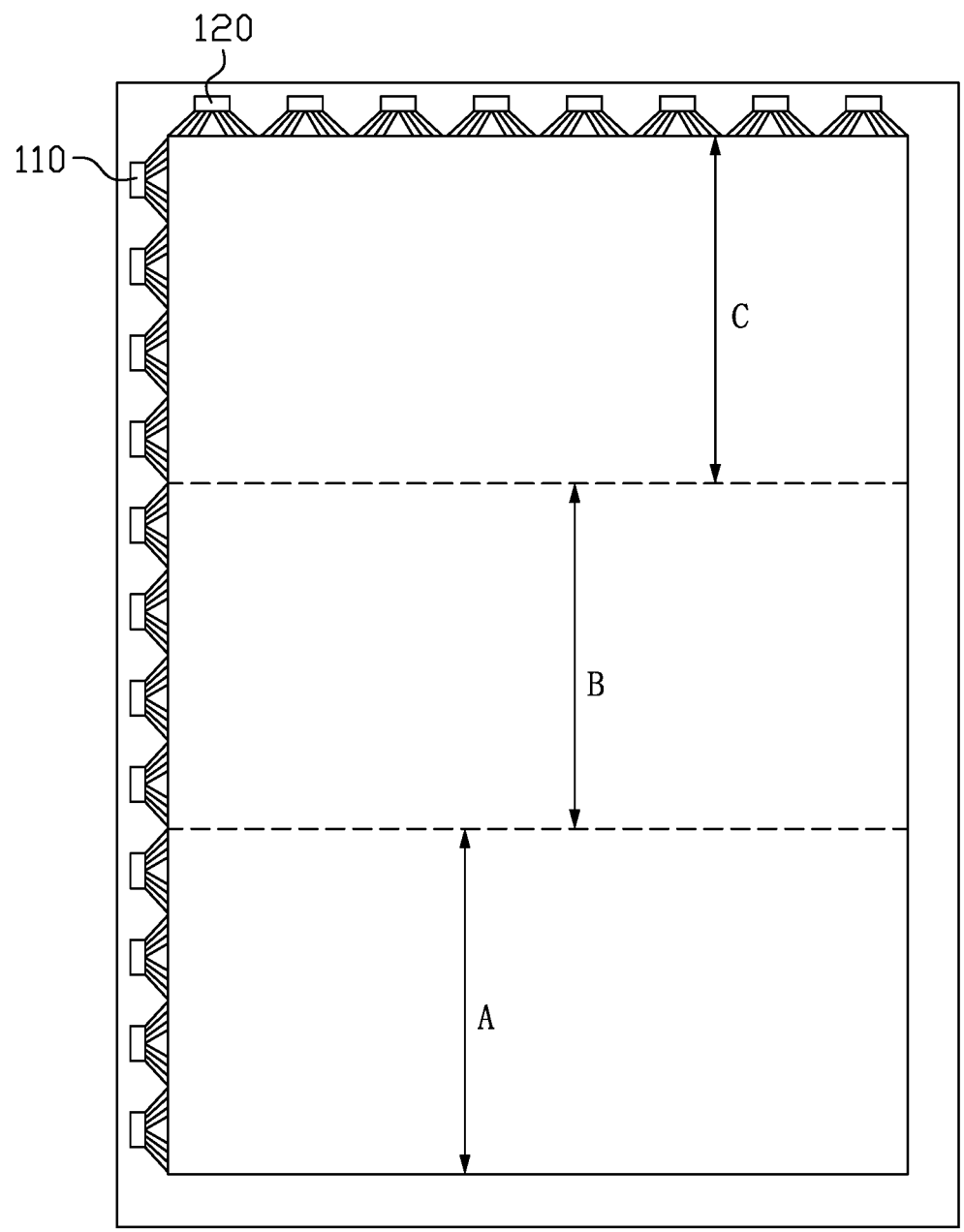
FIG. 2 shows a schematic view of a display panel formed by means of exposure under the mask of FIG. 1.
Figure 3:
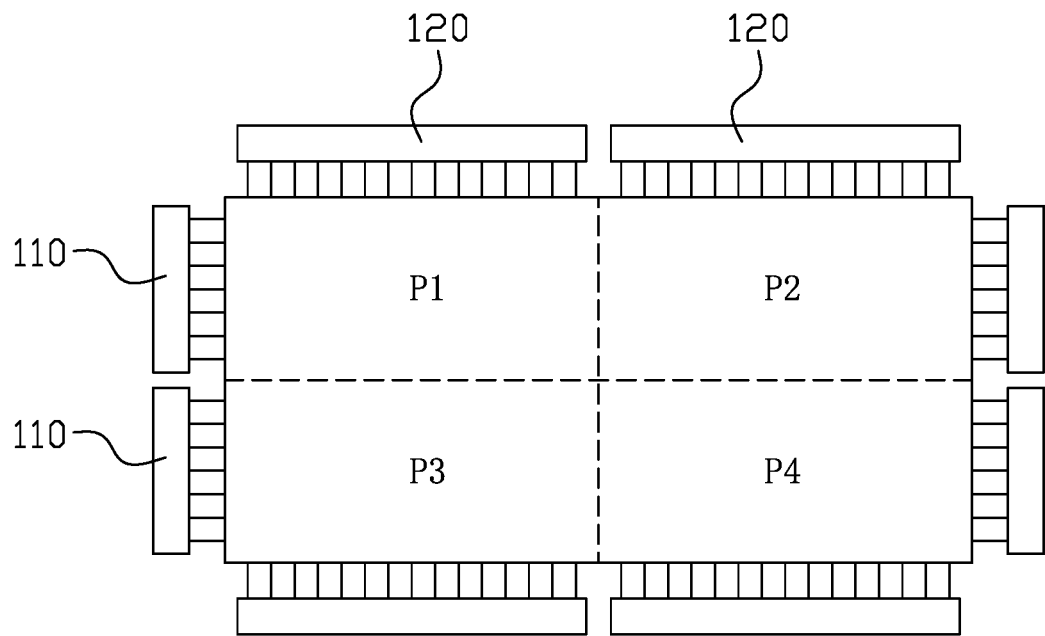
FIG. 3 shows a schematic view of the display panel in FIG. 2 being partitioned into four display areas.
Figure 4:
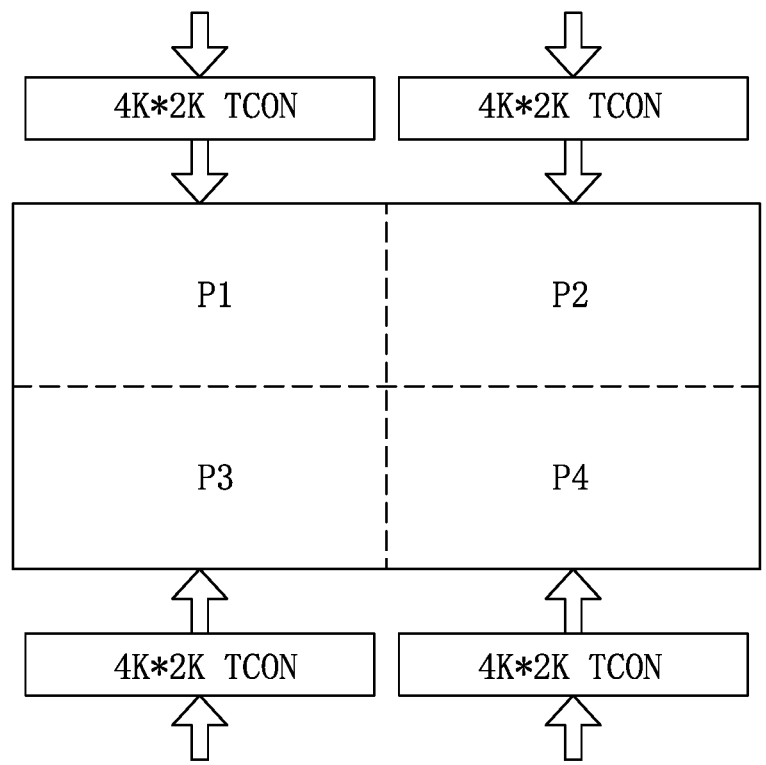
FIG. 4 shows a schematic view of a drive circuit of the display panel in FIG. 3.
Figure 5:
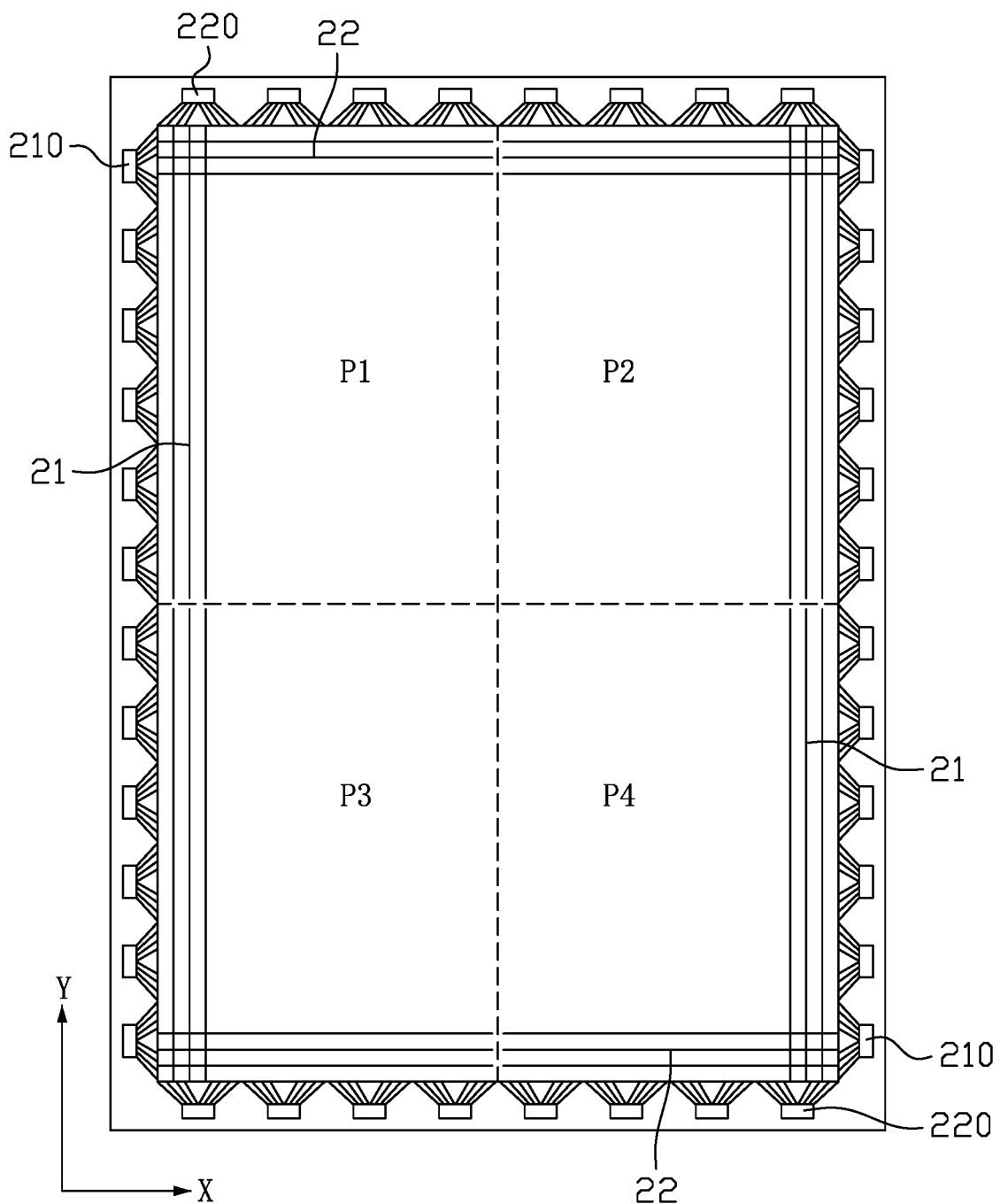
FIG. 5 shows a schematic view of prepared display panel in embodiment 1 of the present disclosure.
Figure 6:
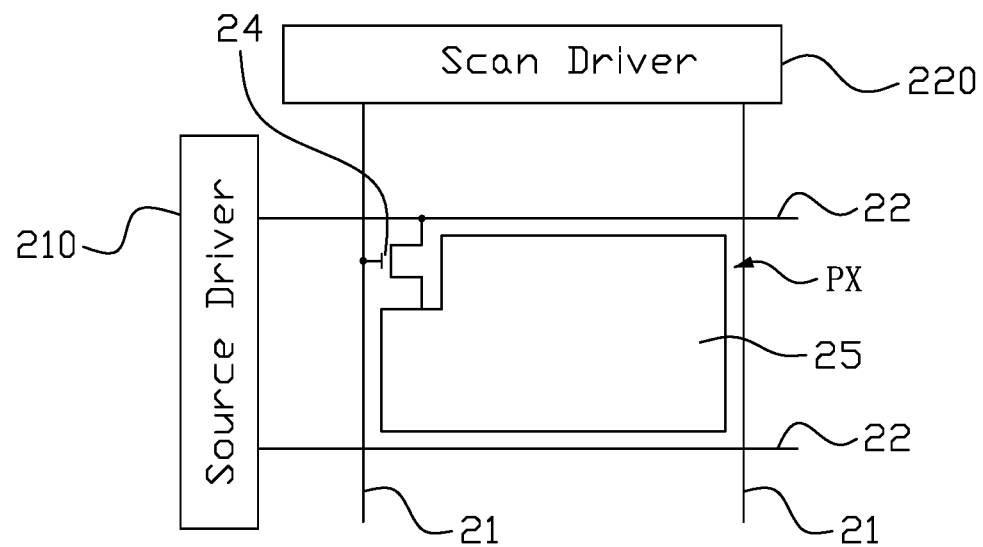
FIG. 6 shows an enlarged view of a pixel cell in FIG. 5.

FIG. 5 shows a schematic view of a display panel prepared in embodiment 1 of the present disclosure. FIG. 6 shows an enlarged view of a pixel cell shown in FIG. 5. The display panel includes multiple pixel cells (abbr. as PX) which are defined by scan lines 21 and data lines 22 insulating and interlacing with each other. In this embodiment, the scan lines 21 are along Y direction, the data lines 22 are along X direction. A source driver 210 and a scan driver 220 are connected to a non-display area of the display panel, the scan lines 21 connect with the scan driver 220, and the data lines 22 connect with the source driver 210. A thin film transistor (abbr. as TFT) 24 and a pixel electrode 25 are provided in each pixel cell.

Figure 7:
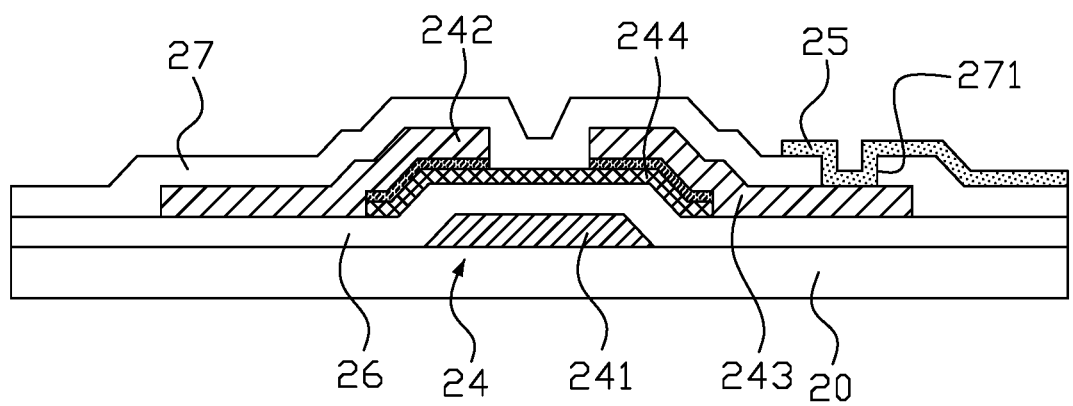
FIG. 7 shows a schematic cross-sectional view of how the display panel corresponds to a thin film transistor as shown in FIG. 5.

FIG. 7 shows a schematic cross-sectional view of where the display panel in FIG. 5 corresponds to the TFT. Please referring to FIGS. 6 and 7, the TFT 24 includes a gate electrode 241, a source electrode 242, a drain electrode 243 and an active layer 244, the gate electrode 241 connects with the scan lines 21, the source electrode 242 connects with the data lines 22, the drain electrode 243 connects with the pixel electrode 25, and the active layer 244 connects with the source electrode 242 and the drain electrode 243 respectively.

A method for preparing the display panel includes the following steps: first, depositing a first metal layer onto a substrate 20, exposing and etching the first metal layer under a first mask to form the scan lines 21 and the gate electrode 241 on the substrate 20. Second, depositing a gate insulation layer 26. Third, depositing an active layer film, exposing and etching the active layer film under an active layer mask to form an active layer 244. Fourth, depositing a second metal layer, exposing and etching the second metal layer under a second mask to form the data lines 22, the source electrode 242 and the drain electrode 243. Fifth, depositing a passivation layer 27, exposing and etching the passivation layer 27 under a third mask to form a contact hole 271 therein. Sixth, depositing a transparent conductive layer, exposing and etching the transparent conductive layer under a fourth mask to form a pixel electrode 25, wherein the pixel electrode 25 is filled in the contact hole 271 and connects with the drain electrode 243.

Figure 8:
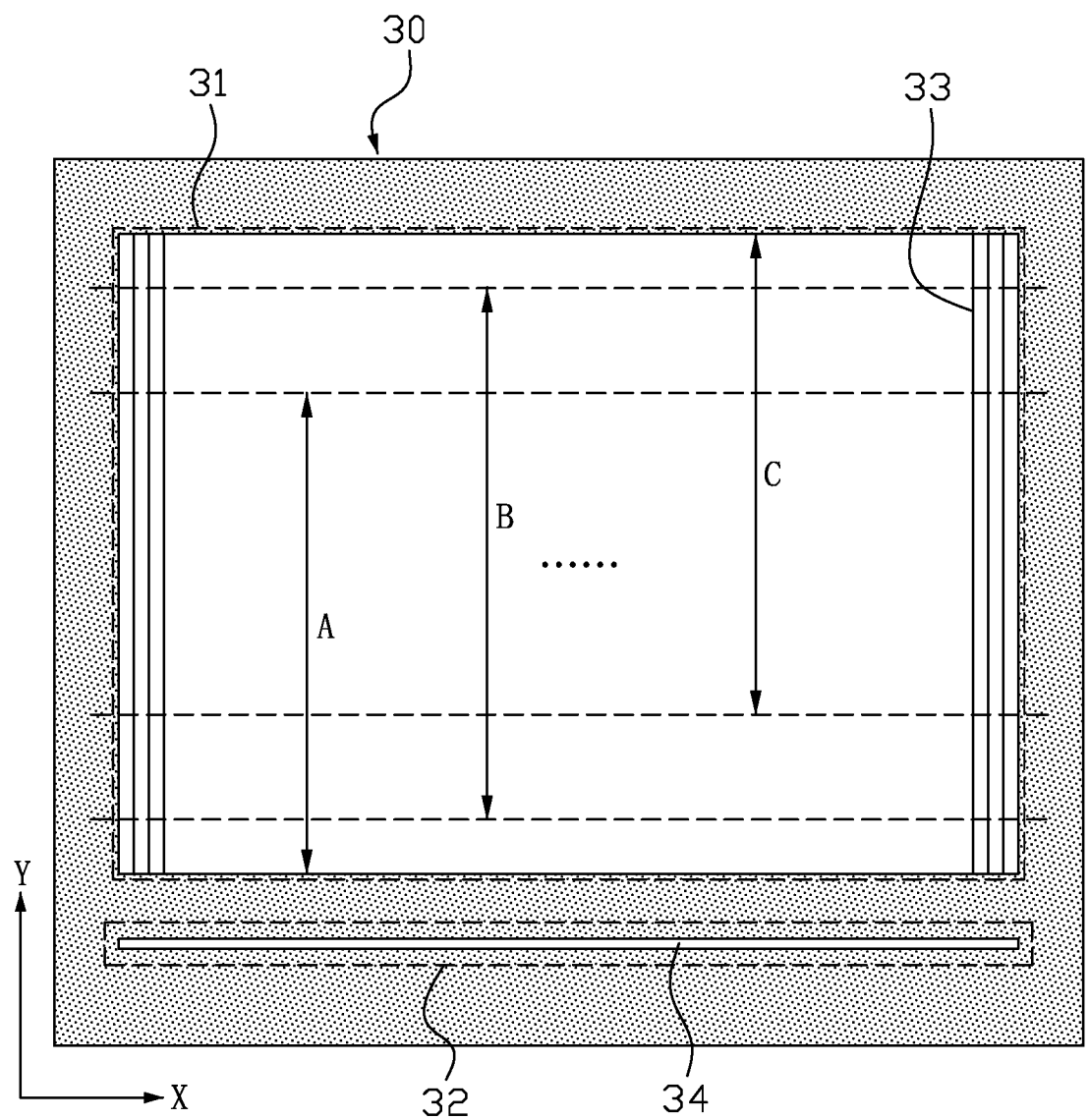
FIG. 8 shows a schematic view of a first mask in the present disclosure.

FIG. 8 shows a schematic view of the first mask in the embodiment of the present disclosure. Please referring to FIG. 8, the first mask 30 provided in the embodiment is used to prepare the scan lines 21 of the display panel by means of exposure. The first mask 30 is provided with a pattern area 31 and a slit area 32, wherein the slit area 32 locates at a periphery of the pattern area 31. Multiple exposure lines 33 are mounted within the pattern area 31. Each exposure line 33 is a continuous line and is parallel to others. These exposure lines 33 are applied to prepare scan lines 21 by means of exposure. A slit 34 is mounted in the slit area 32, which is applied to disconnect the scan lines 21 at intermediate positions by means of exposure.

During the preparation of the large-sized display panel, masks are needed during the method of partial stitching exposure due to the large size of the panel. In this embodiment, the pattern area 31 of the first mask 30 is partitioned into three exposure areas, including a first exposure area A located at the bottom of the pattern area 31, a second exposure portion B located in the middle of the pattern area 31 and a third exposure portion C located at the upper of the pattern area 31. The three exposure areas A, B and C can be partially overlapped, for example, the first exposure area A and the second exposure area B are partially overlapped, and the second exposure area B and the third exposure area C are partially overlapped. Besides, the partition of the three exposure areas A, B and C is also adjustable according to the size of the display panel needed to be prepare. The first exposure area A, the second exposure area B and the third exposure area C are applied to stitching expose three different corresponding areas of the display panel.

In order to save room occupied by the mask, the slit 34 in the slit area 32 is located at one side of the pattern area 31 and next to the pattern area 31. In this embodiment, the slit 34 is located at the bottom of the pattern area 31 and next to the pattern area 31.

The multiple exposure lines 33 in the pattern area 31 of the first mask 30 extend along a first direction, meanwhile, the slit 34 within the slit area 32 extends along a second direction, the second direction is perpendicular to the first direction. In this embodiment, the first direction refers to a Y direction in FIG. 8, and the second direction refers to a X direction therein. In detail, the multiple exposure lines 33 extend along a height direction of the pattern area 31, meanwhile, the slit 34 extends along a width direction of the pattern area 31. Further, the slit 34 is continuous and a length of the slit 34 equals to a width of the pattern area 31, because of this, when intermediate disconnecting the scan lines 21 by the slit 34 by means of exposure, all the scan lines 21 would be intermediate disconnected simultaneously.

Figure 9A:
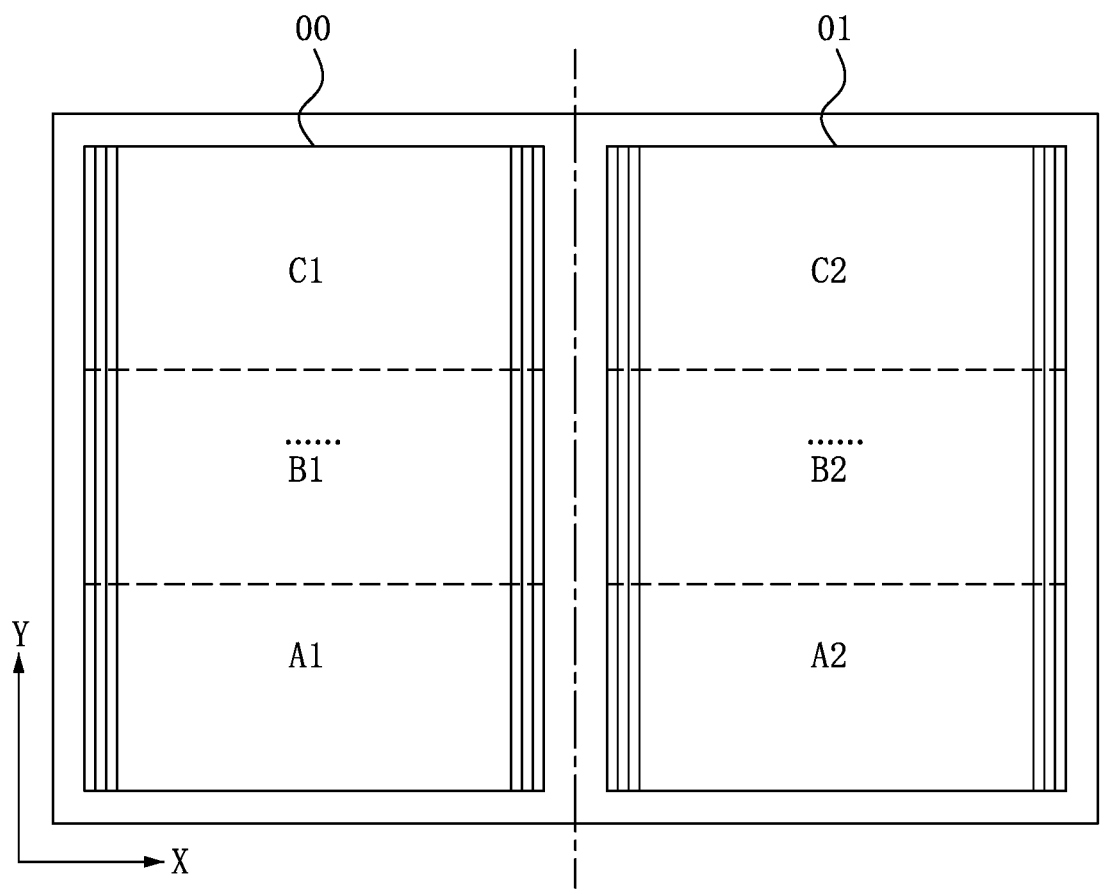
FIGS. 9a-9c are schematic views for preparing the scan lines of the display panel by a method of partial stitching exposure under the first mask in FIG. 8.
Figure 9B:
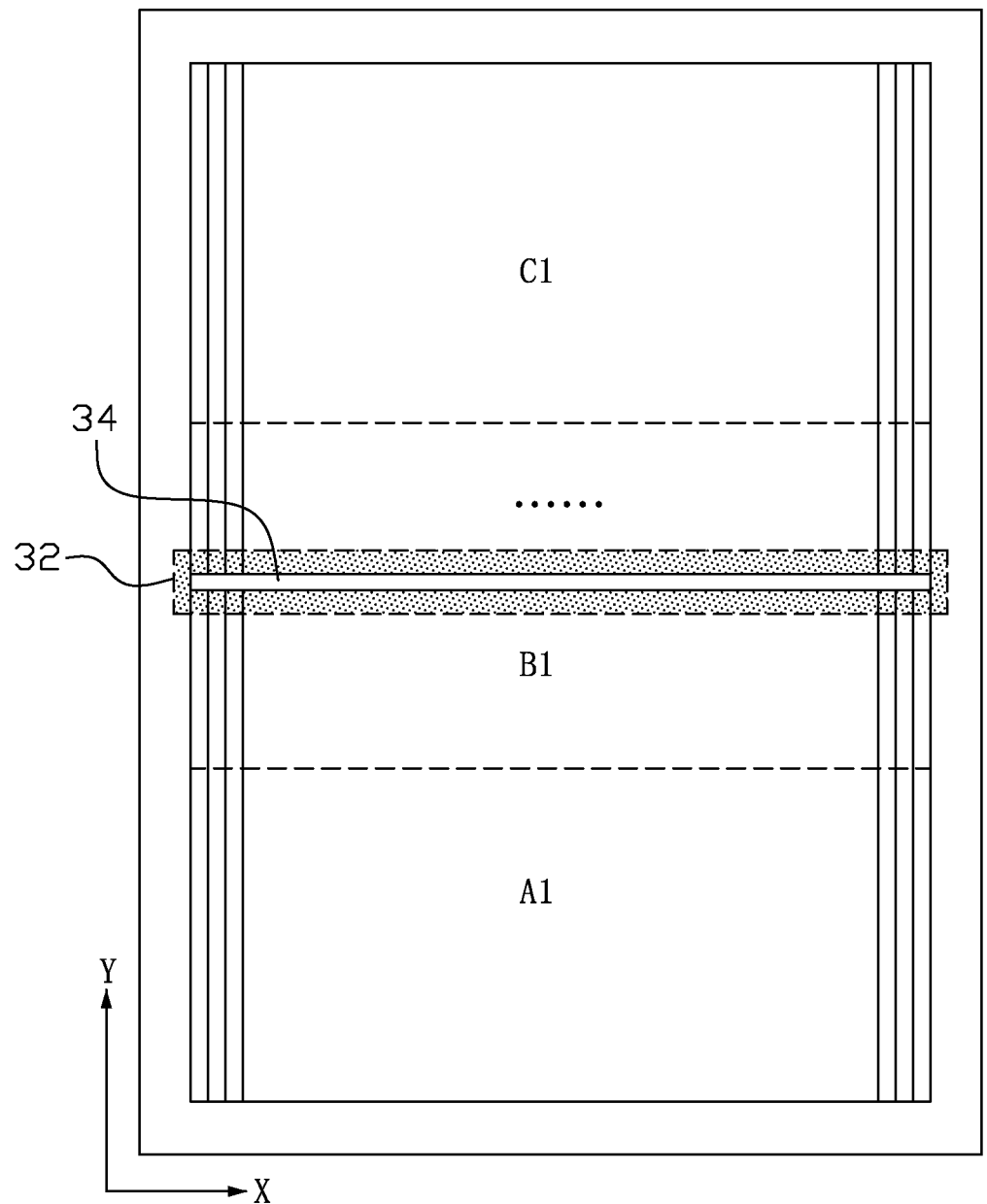
Figure 9C:
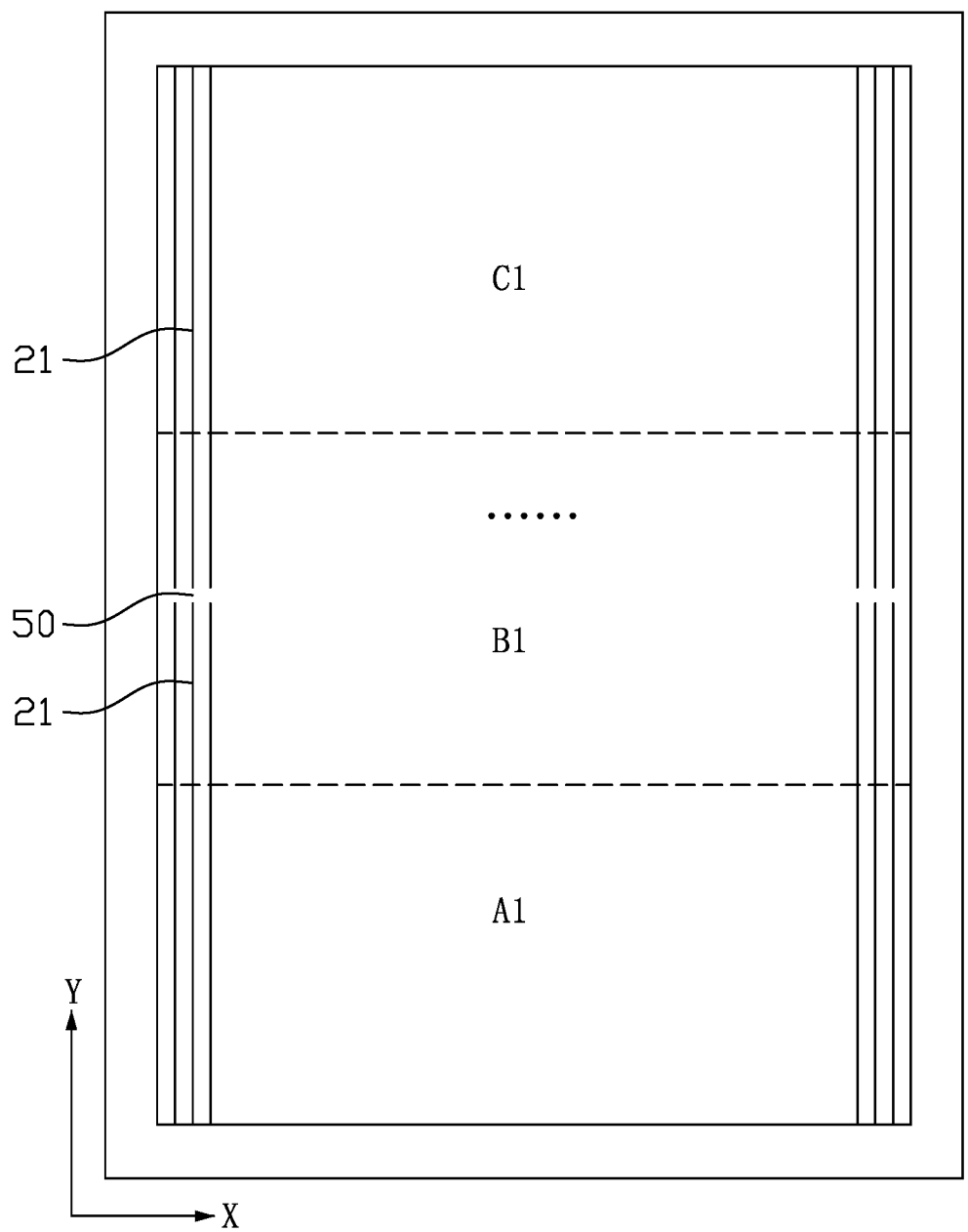
Figure 11:
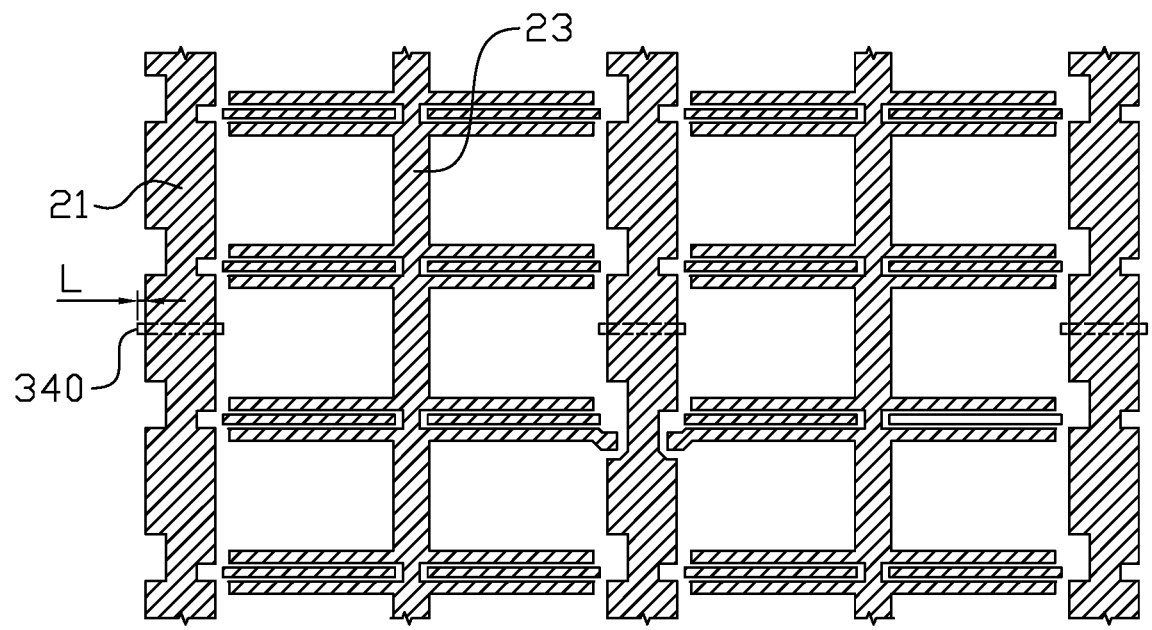
FIGS. 11-12 are schematic views for forming the intermediate disconnection in the scan lines by means of exposure by the slit area shown in FIG. 10.

It should be understood that in the first mask 30 as shown in FIG. 8, only pattern area for preparing the scan lines 21 by means of exposure is shown in FIG. 8, while pattern areas for preparing other structures are omitted. For example, the pattern area used for preparing the gate electrode 241 and that used for preparing a storage capacitance line 23 as shown in FIG. 11 are omitted. Besides, multiple wire harness (see FIG. 5, not labeled) exist between the scan lines 21 and the scan driver 220 are connected thereto. Similarly, the pattern area of the first mask 30 which is used for preparing the wire harness is also omitted. FIGS. 9a-9c illustrate the process for preparing the scan lines 21 of the display panel by means of exposure under the first mask 30 of FIG. 8.

First, coating a first photoresist layer onto a first metal layer previously formed. For example, depositing the first metal layer onto a substrate 20 by sputtering, and then coating the first photoresist layer onto the first metal layer, wherein the first photoresist layer is a positive photoresist.

Next, as shown in FIG. 9a, stitching exposing the different areas of the first photoresist layer along a first direction (Y direction shown therein) by the different pattern areas 31 of the first mask 30 respectively. In this embodiment, a first exposure area A, a second exposure area B and a third exposure area C in the pattern area 31 of the first mask 30 are applied to stitching expose three different areas A1, B1, C1 of the first photoresist layer along the first direction (i.e., Y direction shown therein). That is, the first exposure area A of the first mask 30 is applied to expose a bottom area A1 of the first photoresist layer, the second exposure area B of the first mask 30 is applied to expose a middle area B1 of the first photoresist layer, and a third exposure area C of the first mask 30 is applied to expose an upper area C1 of the first photoresist layer.

During actual preparation, multiple large-sized display panels can be prepared simultaneously at one master plate. Taken FIG. 9a as an example, two large-sized display panels are prepared simultaneously at one master plate. Hence, besides the areas A1, B1 and C1 which serve for preparing one large-sized display panel, the first photoresist layer further includes other areas serving for preparing the other large-sized display panel, and said other areas includes a bottom area A2, a middle area B2 and an upper area C2. At this circumstance, the preparation further includes the steps below: applying the first exposure area A of the first mask 30 to expose the bottom area A2 of the first photoresist layer; applying the second exposure area B of the first mask 30 to expose the middle area B2 of the first photoresist layer; and applying the third exposure area C of the first mask 30 to expose the upper area C2 of the first photoresist layer. In this embodiment, said areas A1, B1 and C1 form a display panel 00; meanwhile, said other areas A2, B2 and C2 form another display panel 10. For simplicity, taken the display panel 00 as an example to illustrate how to prepare the display panel thereof.

As shown in FIG. 9b, aligning the slit 34 in the slit area 32 of the first mask 30 with intermediate positions of each scan lines 21 to be disconnected, and exposing the first photoresist layer by the slit 34 along the second direction (i.e., X direction shown in FIG. 9b), wherein the second direction therein is perpendicular to the first direction. During the exposure, other parts of the first mask 30 are shaded with a baffle. In this embodiment, the first direction is Y direction shown in FIG. 9b, and the second direction is X direction shown therein.

As shown in FIG. 9c, developing the first photoresist layer after exposure, and etching the first metal layer after developing, thus forming multiple scan lines 21 parallel to each other, which are disconnected intermediately, i.e., each scanline 21 is disconnected at an intermediate position 50.

Figure 10:
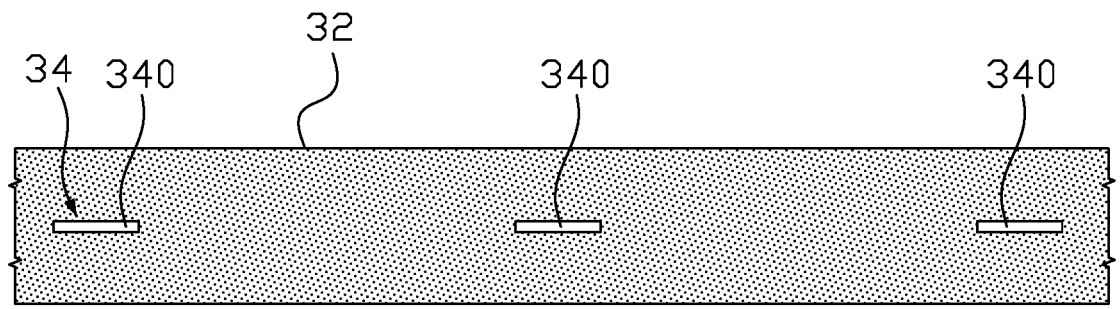
FIG. 10 shows a schematic view of a slit area of the first mask in FIG. 8.
Figure 12:
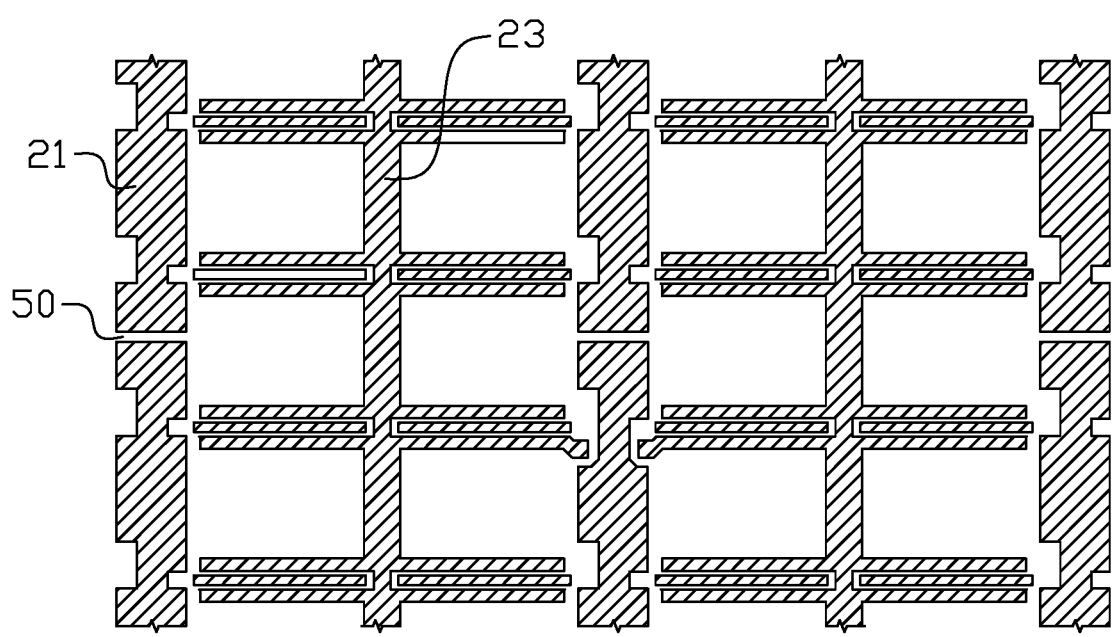

FIG. 10 is a schematic view of one example of the slit area 32 in the first mask 30 of FIG. 8. As shown in FIG. 10, the slit 34 in the slit area 32 of the first mask 30 is discontinuous and includes several slots 340 spacing with each other. These slots 340 correspond to the plurality of exposure lines 33 respectively, and a distance between two adjacent slots 340 equals to that between two adjacent exposure lines 33. In other words, the multiple slots 340 corresponds to the scan lines 21 respectively, and a distance between two adjacent slots 340 equals to that between two adjacent scan lines 21. As shown in FIG. 11, while exposing the first photoresist layer by the slit area 32, each slot 340 exactly corresponds with an intermediate position of the scan lines 21 to be formed. Preferably, a width of each slot 340 is larger than that of the scanline 21, i.e., there is a distance L extending beyond the scanline 21, which is introduced by each side of every slot 340, in other words, each side of the slot 340 extends beyond its corresponding scanline 21 a certain distance L. As shown in FIG. 12, the intermediate position 50 of the scan lines 21 are disconnected after exposure and etching.

Besides, storage capacitance lines 23 are further arranged at the same layer as the scan lines 21 on the display panel; during preparation, the storage capacitance lines 23 and the scan lines 21 are formed by the same metal layer (i.e., the first metal layer) after an etching process. In the presence of the storage capacitance lines 23, a storage capacitor (Cs) is therefore formed between the storage capacitance lines 23 and the pixel electrodes 25. After charging the pixel electrodes 25, the storage capacitor therebetween functions to remain the voltage charged to the pixel electrodes 25 till next charging. Since the slit 34 is discontinuous and includes several slots 340 spacing to each other, the storage capacitance lines 23 in the prepared display panel are continuous and integrated, in other words, all the storage capacitance lines 23 form a grid structure within the display panel. Just because of this, the grid structure makes the storage capacitance lines 23 more stable; further, it is more convenient to apply unified voltages to the storage capacitance lines 23, which is helpful to simplify the circuit design.

Figure 13:
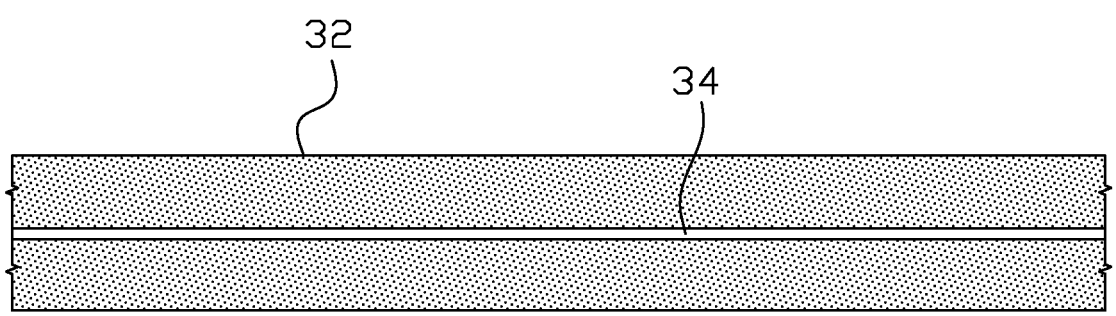
FIG. 13 shows another schematic view of the slit area of the first mask in FIG. 8.
Figure 14:
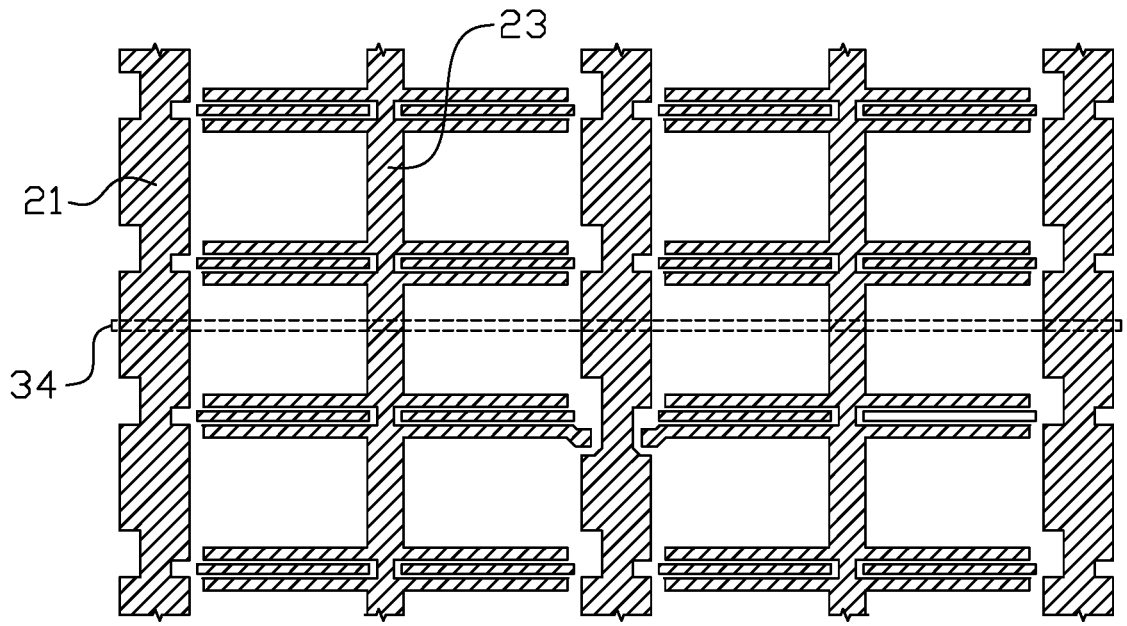
FIGS. 14-15 are schematic views for forming the intermediate disconnection in the scan lines by means of exposure by the slit area shown in FIG. 13.
Figure 15:
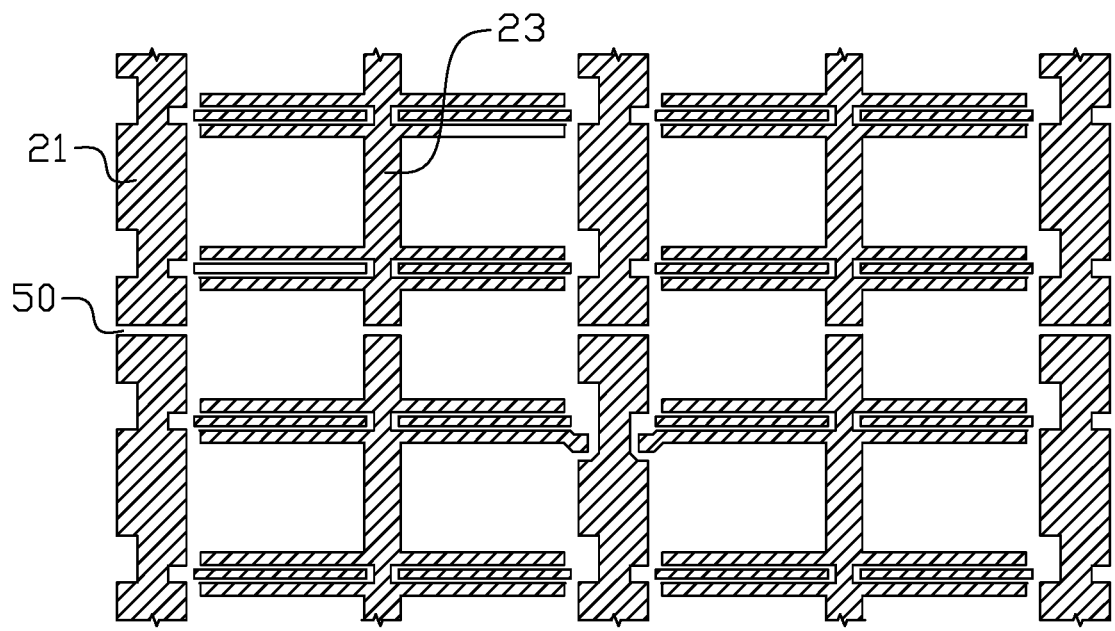

FIG. 13 is a schematic view of another example of the slit area 32 in the first mask 30 of FIG. 8. As shown in FIG. 13, the slit 34 of the slit area 32 in the first mask 30 is continuous, whose length equals to a width of the pattern area 31. At this circumstance, as shown in FIG. 14, while exposing the first photoresist layer by the slit area 32, the continuous rectangular slit 34 stretches across the whole display panel. As shown in FIG. 15, the intermediate positions 50 of the scan lines 21 are disconnected after exposure and etching, meanwhile, the storage capacitance lines 23 in different display areas are also disconnected. Just because of this, voltages can be respectively applied to different storage capacitance lines 23 in different display areas of the prepared display panel, which improves the flexibility of circuit control.

Figure 16:
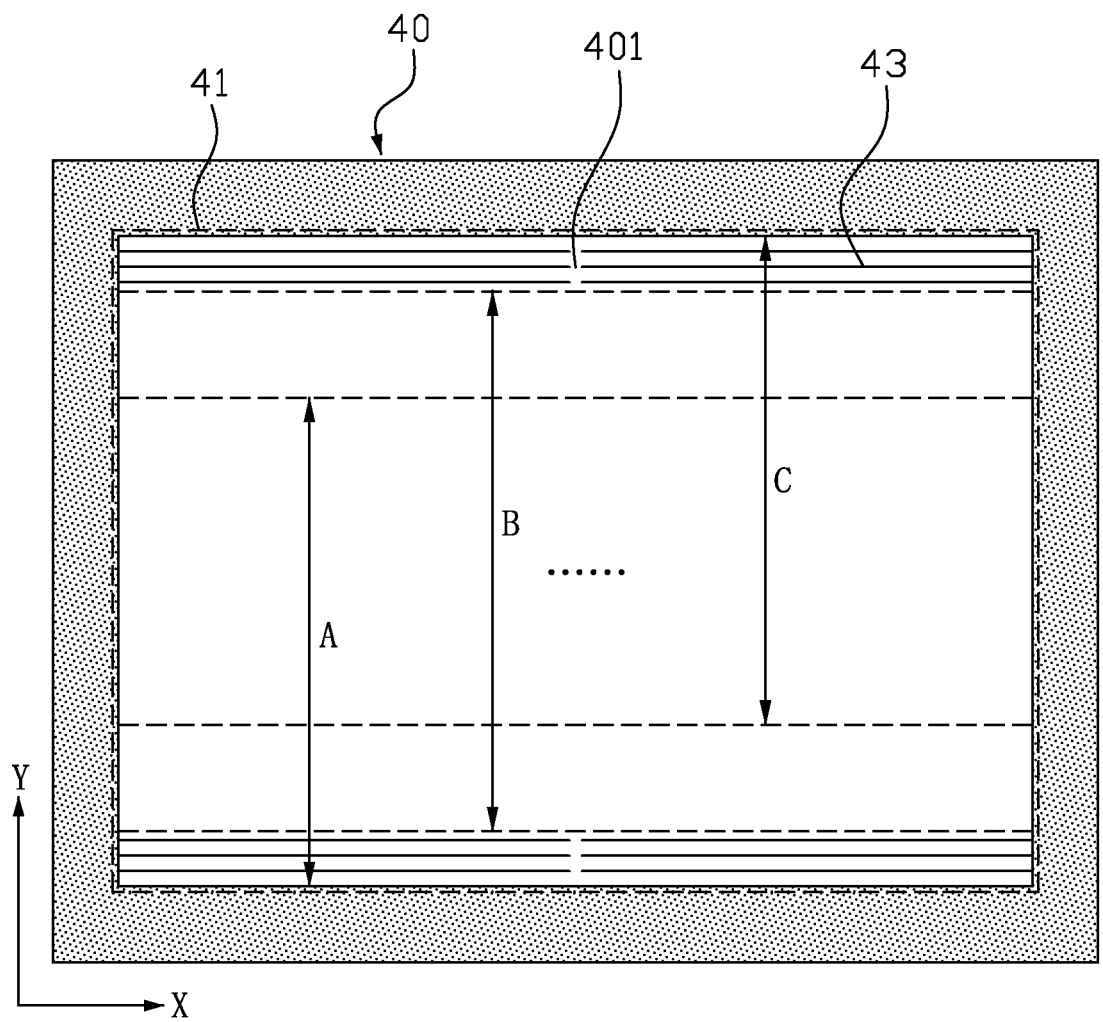
FIG. 16 shows a schematic view of a second mask in the present disclosure.

After forming the scan lines 21, the formation of the data lines 22 follows thereafter. FIG. 16 shows a schematic view of the second mask in the embodiment of the present disclosure. Please referring to FIG. 16, the second mask 40 provided in this embodiment is applied to prepare the data lines 22 by means of exposure. A pattern area 41 is located within the second mask 40, and several exposure lines 43 are arranged in the pattern area 41 thereof. The exposure lines 43 are parallel to each other, and are discontinuous lines that are intermediately disconnected, i.e., each exposure line 43 is disconnected at intermediate positions 401. In this embodiment, the pattern area 41 of the second mask 40 has the same size as the pattern area 31 of the first mask 30. Further, the pattern area 41 of the second mask 40 is also partitioned into three exposure areas A, B and C, i.e., a first exposure area A at the bottom of the pattern area 41, a second exposure area B in the middle of the pattern area 41, and a third exposure area C at the upper of the pattern area 41. Said three exposure areas A, B and C can be partially overlapped between adjacent ones.

Please referring to FIG. 17, a process for preparing the data lines 22 of the display panel is illustrated hereinafter, following the formation of the scan lines 21. The data lines 22 are prepared by a method of partial stitching exposure under the second mask 40 in FIG. 16.

First, coating a second photoresist layer onto a previously-formed second metal layer. For example, depositing a second metal layer onto a gate insulation layer 26 by sputtering, and then coating a second photoresist layer onto the second metal layer. A material of the second photoresist layer is positive photoresists.

Next, different areas of the second photoresist layer are stitching exposed along a first direction (such as Y direction in FIG. 17) by the pattern area 41 of the second mask 40. As shown in FIG. 17, the second photoresist layer is partitioned into three areas, i.e., a bottom area A1, a middle area B1 and an upper area C1. In this embodiment, each of the three areas A1, B1 and C1 of the second photoresist layer are respectively stitching exposed by the first exposure area A, the second exposure area B and the third exposure area C in the pattern area 41 of the second mask 40 along the first direction. That is, the bottom area A1 of the second photoresist layer is exposed by the first exposure area A of the second mask, the middle area B1 of the second photoresist layer is exposed by the second exposure area B of the second mask, and the upper area C1 of the second photoresist layer is exposed by the third exposure area C of the second mask.

Figure 17:
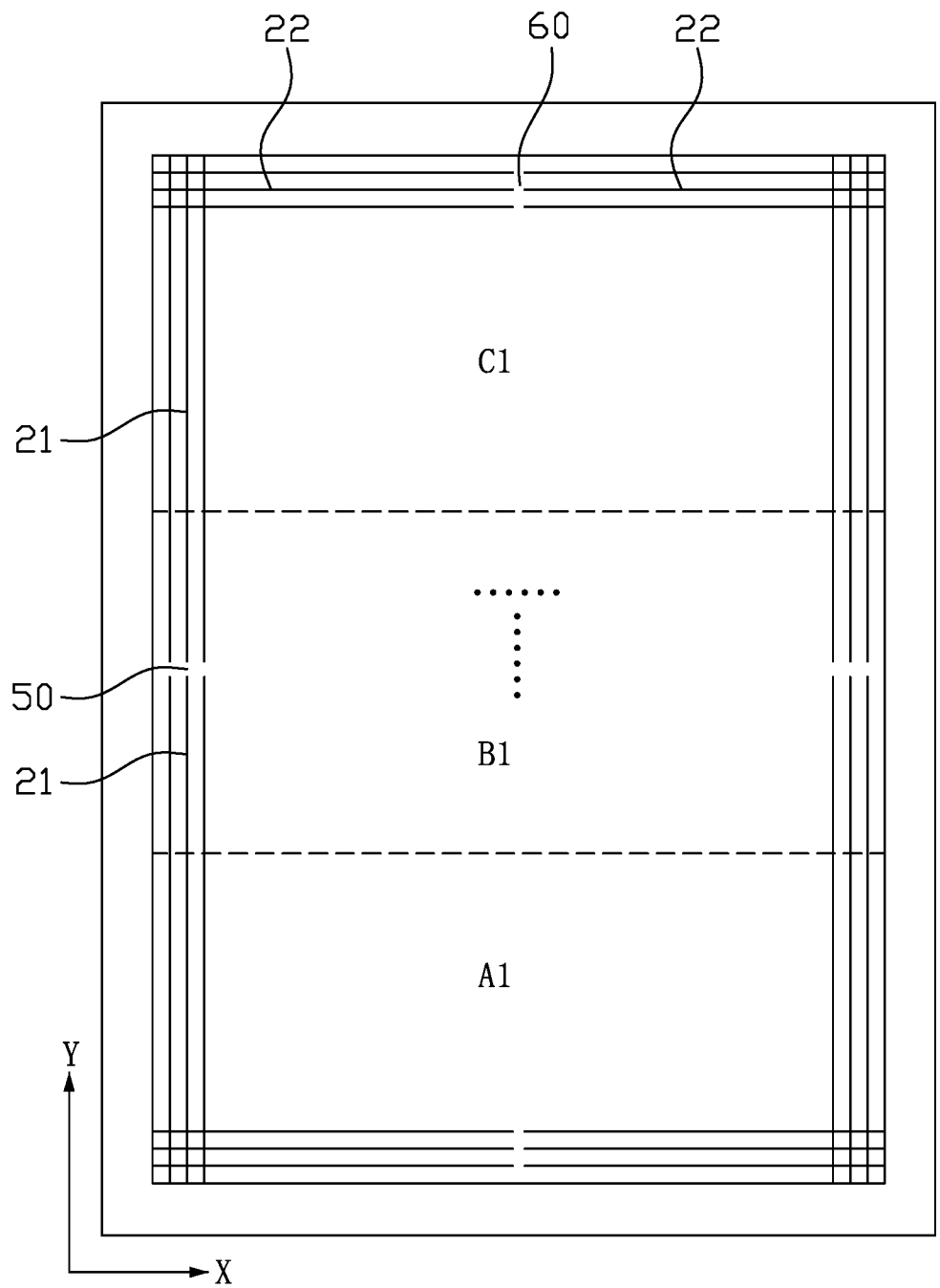
FIG. 17 shows a schematic view for forming the data lines of the display panel by a method of partial stitching exposure under the second mask in FIG. 16.

Then, developing the second photoresist layer after exposure, and then etching the second metal layer after developing, finally a plurality of data lines 22 are formed, which are parallel to each other and are disconnected intermediately, i.e., each data line 22 is disconnected at an intermediate position 60, as shown in FIG. 17. It should be understood that since the second photoresist layer is located on the second metal layer, when the second photoresist layer is exposed and developed, the second metal layer is exposed out, which facilitates its being etched during the etching process.

Besides the preparation of the scan lines 21 and the data lines 22 described above, the preparation of the display panel further includes processes for preparing other layers, such as a gate insulation layer 26, an active layer 244, a passivation layer 27 and a pixel electrode 25 etc., and further includes processes for bonding the source driver 210 and the scan driver 220. However, these processes are irrelevant to the present disclosure, and unnecessary details would not be given herein.

An example of the display panel which is prepared by the above processes is shown in FIG. 5. It should be understood that the display panel in FIG. 5 is just for example. The display panel includes four separate display areas P1, P2, P3 and P4 therein, which are square-shaped. The scan lines 21 and the data lines 22 are mounted in the display panel, which are intermediately disconnected at positions where the display areas P1, P2, P3 and P4 separate with one another, that is, the scan lines 21 and the data lines 22 of different display areas are disconnected. Meanwhile, the scan drivers 220 and the source drivers 210 are arranged at the periphery of the display panel, the scan lines 21 and the data lines 22 in each display area connect with the scan drivers 220 and the source drivers 210 respectively. Because of this, the scan lines 21 and the data lines 22 in each display area are separate with one another, and each display panel is respectively driven by its own scan drivers 220 and source drivers 210.

In the method of the present disclosure, large-sized display panel is formed by a method of partial stitching exposure, wherein the scan lines 21 and the data lines 22 of the display panel are disconnected at intermediate positions. Along this, the display panel is partitioned into four separate display areas by the disconnection positions. Just because of this, the loads of the scan lines 21 and that of the data lines 22 are at least halved, signals transferred thereby are not inclined to be distorted; meanwhile, the number of the scan lines 21 in each display area is halved, and the charging-time to the scan lines 21 is more than doubled. All these solves the problems of distortion, flicker and motion-blurred image etc., and decreases the manufacture difficulty and the production cost of the display panel.

Figure 18:
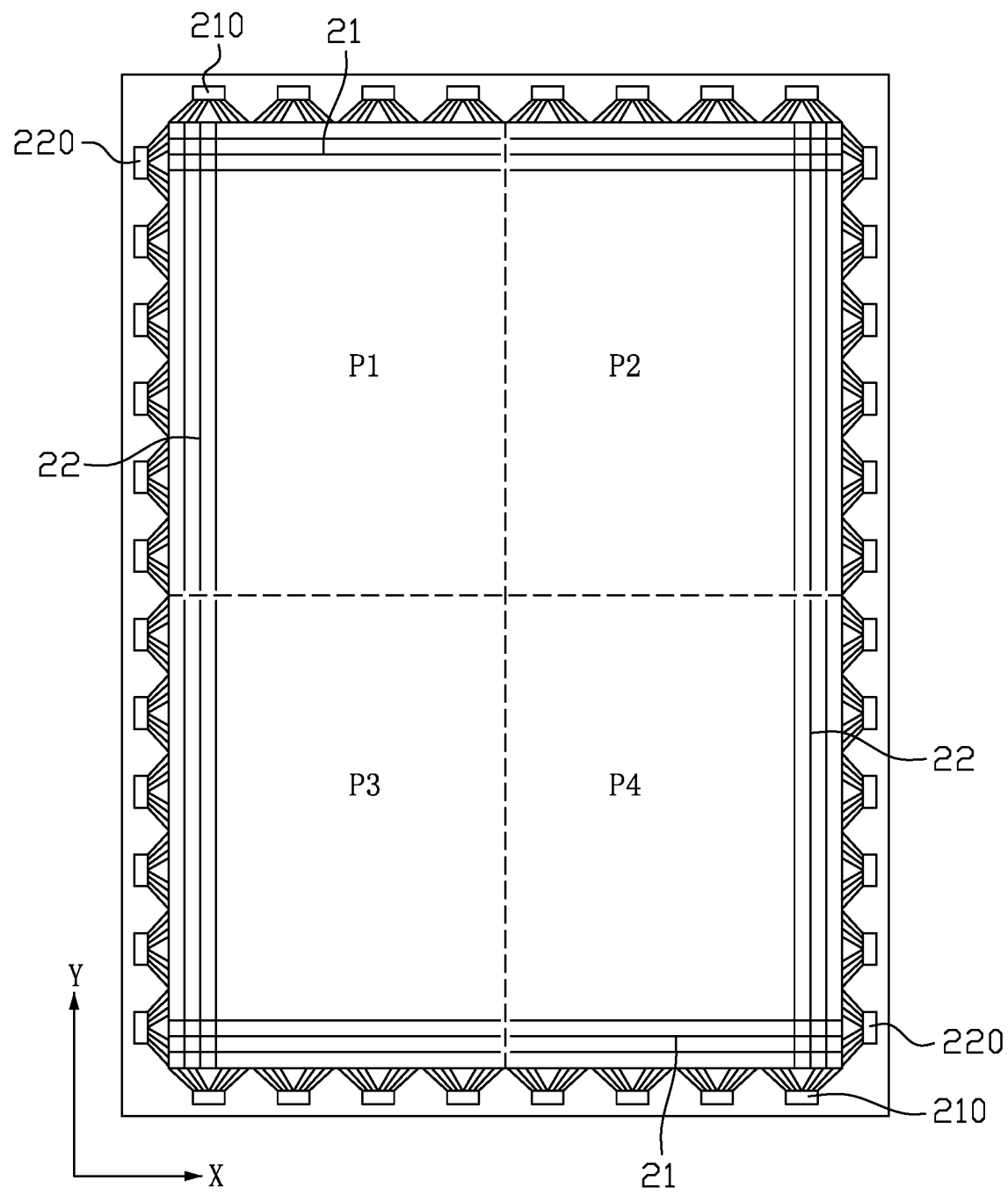
FIG. 18 shows a schematic view of the prepared display panel in embodiment 2 of the present disclosure.

In the embodiments aforementioned, the first mask 30 is applied to prepare the scan lines 21 of the display panel by means of exposure, the second mask 40 is applied to prepare the data lines 22 by means of exposure. FIG. 18 is a schematic view of the display panel prepared in embodiment 2 of the present disclosure. As shown in FIG. 18, at a circumstance where the scan lines 21 switch places with the data lines 22, i.e., the scan lines 21 are along X direction and the data lines 22 are along Y direction, the scan lines 21 are prepared by the second mask 40 by means of exposure, and then the data lines 22 of the display panel are prepared by the first mask 30 by means of exposure. Similarly, the scan lines 21 and the data lines 22 in the prepared display panel are disconnected at intermediate positions thereof, the method for forming the disconnection at the intermediate positions thereof would not be described in detail herein.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

INDUSTRIAL APPLICABILITY

The embodiments of the present disclosure provide a mask and a method for stitching exposure, and large-sized display panels formed by the method of partial stitching exposure. In the method, the scan lines and the data lines are disconnected at intermediate positions during the exposure process, which makes the prepared display panel to be partitioned into four separate display areas. Because of this, the loads of the scan lines and the data lines are at least halved, and signals transferred thereby are not inclined to be distorted; meanwhile, the number of the scan lines in each display area is halved, and the charging-time to the scan lines is more than doubled. All these solves the problems of distortion, flicker and motion-blurred image etc., and decreases the manufacture difficulty and the production cost of the display panel.

What is claimed is:

1. A mask for preparing scan lines or data lines of a display panel by means of exposure, wherein the mask is provided with a pattern area and a slit area located at a periphery of the pattern area, a plurality of exposure lines parallel to each other are provided in the pattern area, the exposure lines are respectively continuous lines and are applied to prepare the scan lines or the data lines by means of exposure; the slit area is provided with a slit, the slit is applied to disconnect each of the scan lines or the data lines at intermediate positions by means of exposure.

2. The mask of claim 1, wherein the pattern area of the mask is partitioned into three exposure areas consisting of a first exposure area, a second exposure area and a third exposure area respectively, the first exposure area, the second exposure area and the third exposure area are applied to stitching expose three different areas of the display panel respectively.

3. The mask of claim 2, wherein the first exposure area locates at the bottom of the pattern area, the second exposure area locates in the middle of the pattern area, the third exposure area locates at the upper of the pattern area, the first exposure area partially overlaps with the second exposure area, and the second exposure area partially overlaps with the third exposure area.

4. The mask of claim 1, wherein the multiple exposure lines extend along a first direction, the slit extends along a second direction, the second direction is perpendicular to the first direction.

5. The mask of claim 4, wherein the multiple exposure lines extend along a height direction of the pattern area, the slit extends along a width direction of the pattern area, and a length of the slit equals to a width of the pattern area.

6. The mask of claim 4, wherein the slit is located at one side of the pattern area and next to the pattern area.

7. The mask of claim 4, wherein the slit is discontinuous and comprises several slots spacing with each other, the several slots correspond to the multiple exposure lines respectively.

8. The mask of claim 4, wherein the slit is continuous, a length of the slit equals to a width of the pattern area.

9. A method of stitching exposure under the mask of claim 1, applied for preparing scan lines or data lines of the display panel by means of exposure, wherein the method of stitching exposure comprising the following steps:
coating a photoresist layer onto a metal layer which is previously formed;
stitching exposing different areas of the photoresist layer respectively along a first direction under a pattern area of the mask;
aligning a slit in the slit area of the mask with intermediate positions of each scanline or data line to be disconnected, and exposing the photoresist layer by the slit along a second direction, wherein the second direction is perpendicular to the first direction;
developing the photoresist layer after exposure, and etching the metal layer after developing, thus forming a plurality of scan lines or data lines which are parallel to each other and disconnected at intermediate positions.

10. The method for stitching exposure of claim 9, wherein the step of stitching exposing different areas of the photoresist layer respectively by the pattern area of the mask along the first direction comprising the following steps: partitioning the pattern area of the mask into three exposure areas consisting of a first exposure area, a second exposure area and a third exposure area separately, and stitching exposing the different areas of the photoresist layer along the first direction by the first exposure area, the second exposure area and the third exposure area respectively.

11. A display panel, comprising several pixel cells which are defined by scan lines and data lines insulating and interlacing with each other, wherein the display panel comprises four separate display areas which are square-shaped, both the scan lines and the data lines of the display panel are disconnected at intermediate positions; one of the scan lines and the data lines is formed under a first mask by means of exposure, the other of the scan lines and the data lines is formed under a second mask by means of exposure; the first mask is the mask described in claim 1, the second mask is provided with a pattern area, and multiple exposure lines parallel to each other are arranged in the pattern area of the second mask, the multiple exposure lines are discontinuous lines which are disconnected at intermediate positions.

12. The display panel of claim 11, wherein the pattern areas of the second mask and the first mask are in the same size.

13. The mask of claim 7, wherein a distance between two adjacent slots equals to that between two adjacent exposure lines.

14. The mask of claim 7, wherein the multiple slots correspond to the scan lines respectively, and a distance between two adjacent slots equals to that between two adjacent scan lines.

15. The mask of claim 7, wherein a width of each slot is larger than that of the scan line.

16. The mask of claim 15, wherein each side of the slot extends beyond its corresponding scan line a certain distance.

17. The mask of claim 1, wherein the mask comprises a first mask and a second mask, the first mask is applied for preparing the scan lines by means of exposure, and the second mask is applied for preparing the data lines by means of exposure.

18. The display panel of claim 11, wherein the data lines of the display panel are prepared following the formation of the scanlines, and the data lines are prepared by a method of partial stitching exposure under a second mask.

19. The display panel of claim 18, wherein the scan lines and/or the data lines are prepared by the following steps:
coating a first/second photoresist layer onto a previously-formed first/second metal layer, wherein the first/second photoresist layer is partitioned into three areas consisting of a bottom area, a middle area and an upper area;
stitching exposing different areas of the first/second photoresist layer along a first direction by a pattern area of the first/second mask, wherein the pattern area of the first mask and/or the second mask comprises a first exposure area, a second exposure area and a third exposure area, each of which corresponds to one of the three areas of the first/second photoresist layer;
developing the first/second photoresist layer after exposure; and
etching the first/second metal layer after developing, thus forming the scan lines/data lines.

* * * * *